United States Patent [19]

Happ

[11] 3,750,277

[45] Aug. 7, 1973

[54] METHOD OF MAKING LEAD FRAMES FOR SEMICONDUCTOR DEVICES

[75] Inventor: Marvin B. Happ, Hingham, Mass.

[73] Assignee: Texas Instruments Incorporated, Dallas, Tex.

[22] Filed: Oct. 23, 1970

[21] Appl. No.: 83,578

[52] U.S. Cl. .................................. 29/624, 29/630 R

[51] Int. Cl. ............................................ H01b 13/00

[58] Field of Search ........................ 29/589, 590, 591, 29/624; 113/119

[56] References Cited

UNITED STATES PATENTS

| | | | |
|---|---|---|---|
| 3,440,027 | 4/1969 | Hugle | 29/193.5 |
| 3,559,285 | 2/1971 | Kauffman | 29/630 |
| 3,537,175 | 11/1970 | St. Clair et al | 29/624 |

OTHER PUBLICATIONS

E. W. Durand, Chemical Machining, Metals Handbook Vol. 3, 8th Edition, 1967, pp. 240, 241, 245.

J. F. Kahles, Electrochemical Machining, Metals Handbook Vol. 3, 8th Edition, 1967, page 233.

*Primary Examiner*—Charles W. Lanham
*Assistant Examiner*—James R. Duzan
*Attorney*—Harold Levine, Edward J. Connors, John A. Haug, James P. McAndrews and Gerald B. Epstein

[57] ABSTRACT

A method of producing lead frames for semiconductor devices in which a sheet of conductive material is initially removed by chemical or electrochemical milling to produce a substantially stress-free reduced thickness portion therein. A lead frame is then stamped from the sheet having lead fingers with substantially stress-free ends which are formed from the thinner material of the reduced thickness portion.

9 Claims, 11 Drawing Figures

METHOD OF MAKING LEAD FRAMES FOR SEMICONDUCTOR DEVICES

This invention relates to packaging of semiconductor devices and more particularly to an improved method of fabricating lead frames for semiconductor devices.

In the packaging of semiconductor devices such as integrated circuit chips, a lead frame is commonly employed to provide means for physically mounting the chip and electrically interconnecting the integral circuitry elements of the device with terminal pins. Such a frame includes integral inwardly extending lead fingers which are conductively connected at their inner free ends to the multiple contacts or terminals of the semiconductor chip. After encapsulation of the assembly, the outer ends of these fingers constitute terminal pins to be plugged into engagement with mating terminals of a socket and thereby electrically interconnect the semiconductor device to other circuitry.

Integrated circuit chips have been mounted by securing the chip to a pad which is centrally located on a lead frame. Small-diameter wires, e.g., having a diameter of about 0.001 inch, are then interconnected between the circuit termination points or contacts on the top of the chip and the individual fingers of the lead frame.

More recently, integrated circuits have been packaged by a method involving a "flip-chip" concept. According to such a method, the chip is inverted or "flipped" over and the contacts or termination points of the integrated circuit are brought into direct contact with the ends of the lead fingers and then simultaneously directly bonded thereto. All interconnecting lead wires are eliminated, along with the expense and difficulties of making connections by use of individual thin wires. Lead frames useful in "flip-chip" type integrated circuit packaging are shown, e.g., in co-pending and coassigned U.S. Pat. application Ser. No. 885,522, filed Dec. 15, 1969.

Because of the typically very small size of integrated circuit chips, the converging free ends of the lead fingers of a lead frame are necessarily of very small width. This is particularly true where the "flip-chip" approach is employed, since the lead fingers must extend inwardly to the locations of the circuit terminations on the chip. The lead frame is normally produced by stamping a sheet or strip of metal, and to allow stamping of lead fingers having such narrow free ends it is necessary that the metal from which the free ends are formed be very thin, e.g., on the order of 0.002 inch. The thinness of the free ends of the lead fingers also renders them flexible and facilitates bringing them into alignment with the chip terminations. In order to provide a lead frame and terminal pins of adequate strength, however, the entire lead frame cannot be fabricated from material as thin as 0.002 inch. A preferable thickness for the outer frame members is on the order of 0.010 inch. Thus the lead frame is normally stamped from stock whose thickness is generally about 0.010 inch, but which has a reduced thickness or depression in the area from which the free ends of the lead fingers are formed. The depression is commonly about 0.008 inch deep so that the free ends of the lead fingers have the desired 0.002 inch thickness.

Among the known methods of producing reduced thickness portions or depressions in lead frame stock are techniques such as spot facing and dimpling. However, the use of either spot facing or dimpling results in the formation of stresses in the reduced thickness portion of the stock from which the free ends of the lead fingers are formed. In the dimpling method, for example, a concavity is formed in one surface of a sheet of conductive material and a corresponding protrusion is formed in the other surface by a method of mechanical deformation, such as by a punch and die. The protrusion is removed, typically by mechanical abrading, to form the desired reduced thickness portion in the sheet. Both dimpling and mechanical abrading produce stresses in the part of the sheet which becomes the reduced thickness portion. The extent of stressing can be lessened somewhat by the use of electrochemical grinding in lieu of conventional mechanical abrading for removing the protrusion. However, a substantial proportion of stresses produced in the reduced thickness portion are generated during the dimpling step itself and, of course, the method employed in removing the protrusion can have no effect on these stresses. To the extent that these stresses are unevenly distributed, the free ends of the lead fingers may become curled, buckled or otherwise distorted from a commonplane, making difficult their attachment to a semiconductor device. It is possible to anneal the lead frames or the stock from which they are stamped. Proper annealing is rendered difficult, however, by the substantial variation in thickness between the main body of the stock or lead frame and its reduced thickness area.

Among the several objects of the present invention, therefore, may be noted the provision of a lead frame for semiconductor devices having lead fingers whose free ends are of a significantly lesser thickness than the remainder of the lead frame; the provision of such a lead frame wherein the free ends of the lead fingers are substantially stress-free; the provision of a process for fabricating lead frames wherein the free ends of the lead fingers are produced initially in a stress-free condition without the need for annealing either the free ends or the reduced thickness material from which they are produced; and the provision of novel stress-free stock material for fabricating lead frames having lead fingers whose free ends are of such a character as to be readily weldable to the terminals of a semiconductor chip. Other objects and features will be in part apparent and in part pointed out hereinafter.

Briefly the present invention is directed to a method of fabricating lead frames for semiconductor devices including forming a reduced thickness portion in a sheet of conductive material by removing a portion of the conductive material by oxidation of the surface atoms of the conductive material through electron exchange with ionic components of a solution placed in contact with an area of the surface and dissolution of the resultant cations of the conductive material in the solution. This forms a concavity in the surface of the sheet without inducing stresses in the material. From this sheet is then blanked a lead frame having integral inwardly extending lead fingers with free ends which are formed from the thinner material of the reduced thickness portion. The invention is further directed to such a method wherein a layer of a metal compatible with a semiconductor device is applied to a surface of the sheet and metallurgically bonded thereto. The layer is of such dimensions and so located as to cover the reduced thickness portions from which the free ends of the lead fingers are formed. Also included in the invention is stock for fabricating lead frames for semiconductor devices comprising a sheet of conductive material having a substantially stress-free reduced thickness portion therein. One side of the reduced thickness portion is substantially flat and flush with a surface of the sheet. This surface of the sheet has a layer of a metal compatible with the device metallurgically bonded to it. The layer has one dimension not substantially greater than the width of the reduced thickness portion and is so located as to substantially coat an area of the reduced thickness portion.

In the accompanying drawings, in which certain methods and products of this invention are illustrated, FIG. 1 schematically illustrates an initial step of this invention in which a sheet of conductive material is electrochemically milled;

Corresponding reference characters indicate corresponding parts throughout the several views of the drawings.

In accordance with the present invention, stock for fabricating lead frames is produced which comprises a sheet of conductive material having a substantially stress-free reduced thickness portion therein. A lead frame is stamped from this stock having lead fingers whose free ends are formed from the substantially stress-free reduced thickness portion. The lead frame thus produced is used in packaging semiconductor devices without incurring the difficulties associated with curling or buckling of the free ends of the lead fingers. No annealing of either the reduced thickness portion of the stock or of the free ends of the lead fingers is required. Also provided in this invention is lead frame stock from which lead frames may be produced having an easily weldable layer of metal compatible with a semiconductor device coating the flat sides of the lead fingers. This allows attachment of the terminals of a semiconductor device to the flat sides of the lead fingers. Since the flat side of the lead frame stock is unaffected in forming the concavity according to the method of this invention, it retains the high degree of flatness produced in the rolling process by which sheet conductive material is conventionally formed. As a consequence, the flat side of the lead fingers of lead frames stamped from such stock have a correspondingly high degree of flatness, free of roughness or substantial curvature. Thus, secure low-resistance connections can be readily and consistently made between the flat side of the lead fingers and the termination points on a semiconductor chip.

In the practice of the present invention, a reduced thickness portion of a sheet of conductive material is produced by chemical or electrochemical milling. Each type of such material removal process involves the oxidation of surface atoms of the conductive material through electron exchange with ionic components of a solution placed in contact with an area of the surface. Cations of the conductive material formed on oxidation of the surface atoms thereof are dissolved in the solution. As do other milling processes, chemical and electrochemical milling produce a reduced thickness portion in the surface of the sheet, thus converting the sheet to the configuration of lead frame stock familiar to the art. However, unlike the stock previously known, the reduced thickness portion of the stock produced by the method of my invention is stress free as formed. Annealing is never necessary. Blanking by conventional methods of the stock so produced results in the production of a lead frame whose lead fingers have substantially stress-free free ends.

Figure 1:
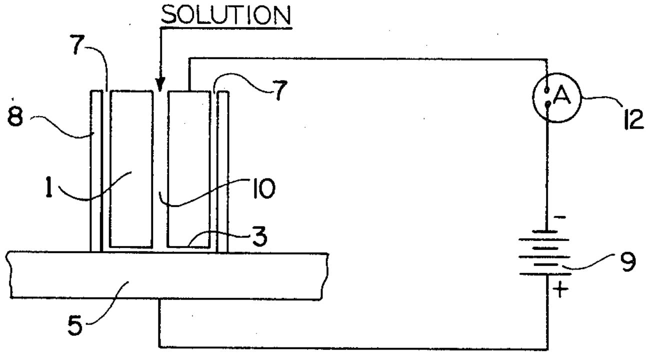
Figure 3:
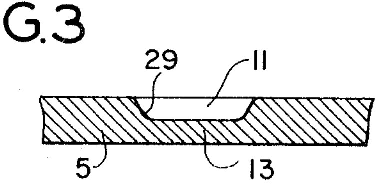
FIG. 3 is a cross section showing a concavity in a sheet of conductive material and a corresponding reduced thickness portion thereof formed by either of the milling steps of FIGS. 1 and 2.

Referring now to FIG. 1, an electrode 1 having a face 3, whose projection on the sheet is approximately the size and shape of a cavity to be produced, is brought into proximity with a sheet 5 of conductive material. Sheet 5 is constituted by a material such as Kovar, Alloy 42, mild steel, SAE 1010 Steel or the like and has a thickness on the order of 0.010 inch. The material called Kovar has a nominal composition, by weight, of 53 percent iron, 29 percent nickel, and the balance cobalt; Alloy 42 has a nominal composition, by weight, of 42 percent nickel and the balance iron; and SAE 1010 Steel has a nominal composition, by weight, of 0.08 to 0.13 percent carbon, 0.30 to 0.60 percent manganese, 0.040 percent (Max.) phosphorous, 0.050 percent (Max.) sulfur, and the balance iron. A conductive solution is caused to flow through an annular duct 7 between an annular sleeve 8 and electrode 1 toward sheet 5, across the gap between face 3 of electrode 1 and sheet 5, and then out through a duct 10. Alternatively, the solution may flow toward sheet 5 through duct 10 and away from the sheet through annular duct 7. A voltage is applied across the gap between face 3 of electrode 1 and sheet 5 by electrically connecting the negative terminal of a direct current power source 9 to the electrode and electrically connecting the positive terminal of the direct current power source to the sheet. Electrons are withdrawn from the sheet 5 by power source 9, causing the surface atoms of the sheet to be oxidized and to enter the solution as cations. As the power source withdraws electrons from sheet 5, it supplies electrons to an ionic component of the solution through electrode 1. The resulting electron exchange causes reduction reactions to take place at electrode 1 and maintains the balance of charges in the solution. By continued application of a voltage differential using power source 9, material is progressively removed from the surface of sheet 5 opposite electrode face 3 until a concavity 11 of the desired depth (preferably on the order of 0.008 inch) and a corresponding reduced thickness portion 13 are formed in the sheet (FIG. 3). An ammeter 12 indicates the rate of oxidation of the surface of the sheet. The depth of the concavity produced in the sheet may be controlled by maintaining a given current for a predetermined period of time. The reduced thickness portion 13 is substantially stress free and the sheet is used, without annealing, for the fabrication of lead frames, the free ends of whose lead fingers are formed from the reduced thickness portion.

Electrode 1 may be fabricated from any conductive material which forms a conductive inert cathode in the solution used. Copper, brass or tungsten electrodes may be used. Copper is preferred. The electrode is normally cylindrical in shape and face 3 is normally flat. Face 3, however, may be slightly convex or partly flat and partly convex. In one embodiment of this invention the area to be milled is brought successively to several electrode stations for progressive thickness reduction. Flat-faced electrodes are used at the initial electrode stations while convex electrodes are utilized at the finishing stations. The electrode is preferably held stationary during milling but may be advanced toward sheet 5 and/or caused to rotate about an axis which is substantially normal to the plane of the surface of sheet 5. Such rotation promotes uniform oxidation of the surface of sheet 5 and thus the formation of a substantially flat and smooth surface of reduced thickness portion 13. Where the electrode is rotated, it is not necessary that it be cylindrical. In this embodiment of the invention, it is satisfactory to utilize an electrode of, e.g., thin rectangular cross section.

An electrolytic solution which has been found to be especially useful in the practice of this invention is a solution of sodium chlorite. Other alkali metal chlorites such as lithium chlorite and potassium chlorite are also useful. The strength of the electrolytic solution is not critical. The solution should be sufficiently conductive to allow a current density of about 45 to 230 amp/in$^2$ at a voltage of between about 15 and 30 volts through a gap of about 0.006 inch to 0.012 inch between sheet 5 and face 3 of electrode 1. The solution is caused to flow at a rate sufficient to avoid any substantial increase in temperature resulting from the current flow.

In a preferred embodiment of this invention, a solution containing approximately 32 percent by weight sodium chlorite is flowed through a gap of about 0.008 inch between sheet 5 and face 3 of electrode 1. A voltage of about 20 volts is applied resulting in a current density of about 140 to 185 amp/in$^2$. The electrolytic solution is flowed at a rate sufficient to maintain the temperature at between about 60° and 100° F., preferably 66° to 75° F. A concavity 0.008 inch deep is produced within about 20 seconds.

Figure 2:
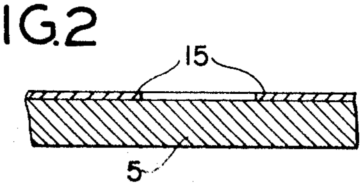
FIG. 2 illustrates an alternate initial step of chemically milling a sheet of conductive material.

In an alternative embodiment of the present invention illustrated in FIG. 2, the surface of sheet 5 is masked, as by an etch resist masking material 15, in the area surrounding the portion of the surface to be milled. An etch solution which is capable of oxidizing and dissolving the surface atoms of the sheet 5 is then brought into contact with the surface of the sheet in the exposed area surrounded by the masking 15. Chemical electron exchange from surface atoms of the sheet to ionic components of the etch solution results in oxidation of the former and concomitant reduction of the latter. Almost any solution which attacks the conductive material of sheet 5 without forming insoluble products thereon can be used as the etch solution. Particularly useful etches include aqueous ferric chloride solution and mixtures of sulfuric and chromic acid. After the etch solution has been allowed sufficient time to work on the surface of sheet 5, a concavity 11, preferably about 0.008 inch deep, and a corresponding reduced thickness portion 13 are produced in the sheet as shown in FIG. 3. The etch solution is thereupon removed from contact with the sheet, the sheet is rinsed and the etch resist mask is removed.

In a preferred embodiment of chemical milling, a 36° Be ferric chloride solution is brought into contact with the surface of sheet 5 at a temperature of between about 115° F. and about 125° F. On contact with the solution, surface atoms of sheet 5 are oxidized and dissolved, yielding electrons which are simultaneously exchanged with the ferric ions of the solution, thereby reducing the latter to ferrous ions.

To ensure the formation of a stable low-resistance connection between an integrated circuit chip and a lead frame, it is very helpful to have an easily weldable metal compatible with the semiconductor device metallurgically bonded to the free ends of the lead fingers where they are directly connected to the chip. Conveniently, a coating of such a metal is provided on the free ends of the lead fingers by applying a layer of such a metal to the reduced thickness portion of lead frame stock. The metal which constitutes the layer is one which is easily weldable and forms a low resistance connection between the termination points on the device and the free terminal ends of the lead fingers of a lead frame. Typically, the layer is formed of aluminum or gold in a thickness of about 0.0002 inch, for example. The metal employed in forming the layer is compatible with the device, i.e., the boundaries of the termination points.

Figure 4:
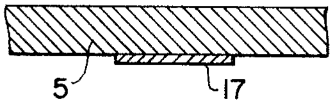
FIG. 4 is a transverse cross section of a sheet showing a stripe of easily weldable metal bonded thereto.
Figure 5:
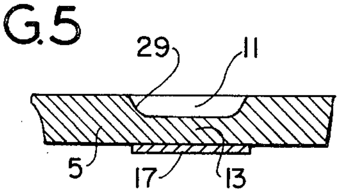
FIG. 5 shows the sheet of FIG. 4 after a concavity and a corresponding reduced thickness portion have been produced therein.

Normally the layer of compatible metal is applied to the surface of the reduced thickness portion adjacent the concavity in the surface of the sheet. In accordance with this invention, however, as illustrated in FIGS. 4 and 5, a layer 17 is applied to a side of a sheet of conductive material 5 and a concavity 11 produced in the other surface thereof by chemical or electrochemical milling. The resulting stock is adapted for the fabrication of lead frames whose lead fingers have an easily weldable metal in their flat sides. As indicated above, the flat sides of the lead fingers of such lead frames are substantially free of roughness or curvature and are thus particularly well adapted for secure low-resistance conductive connection to the termination points on a semiconductor device.

Where lead frames are produced on a mass scale, sheet 5 is preferably an elongate strip and the layer 17 is in the form of a stripe at least 0.0001 inch thick extending longitudinally thereof. Pilot holes 16 are provided for guiding and positioning the strip during processing. Such an arrangement, illustrated in FIG. 6, ensures that the free ends of the lead fingers of a lead frame stamped from the strip anywhere along its length are coated with the desired metal. The stripe is located in the area of the strip in which the reduced thickness portions are produced and is preferably not substantially wider than the width of the reduced thickness portions, yet wide enough to substantially coat them. Various conventional methods may be employed in applying such a stripe. Exemplary methods include various types of vapor deposition such as, e.g., electron beam vapor deposition and various methods of solid phase bonding such as cold roll bonding and hot roll bonding. Particularly useful solid-phase bonding techniques are those described in Boessenkool et al. U.S. Pat. Nos. 2,691,815 and 2,753,623 and Siegel U.S. Pat. No. 2,691,816. The reduced thickness portions are produced in the sheet by chemically or electrochemically milling the surface of the sheet opposite the surface to which the stripe is applied at spaced points along its length. The stock thus produced is adapted for economical mass production of lead frames of the above-noted type.

Figure 7:
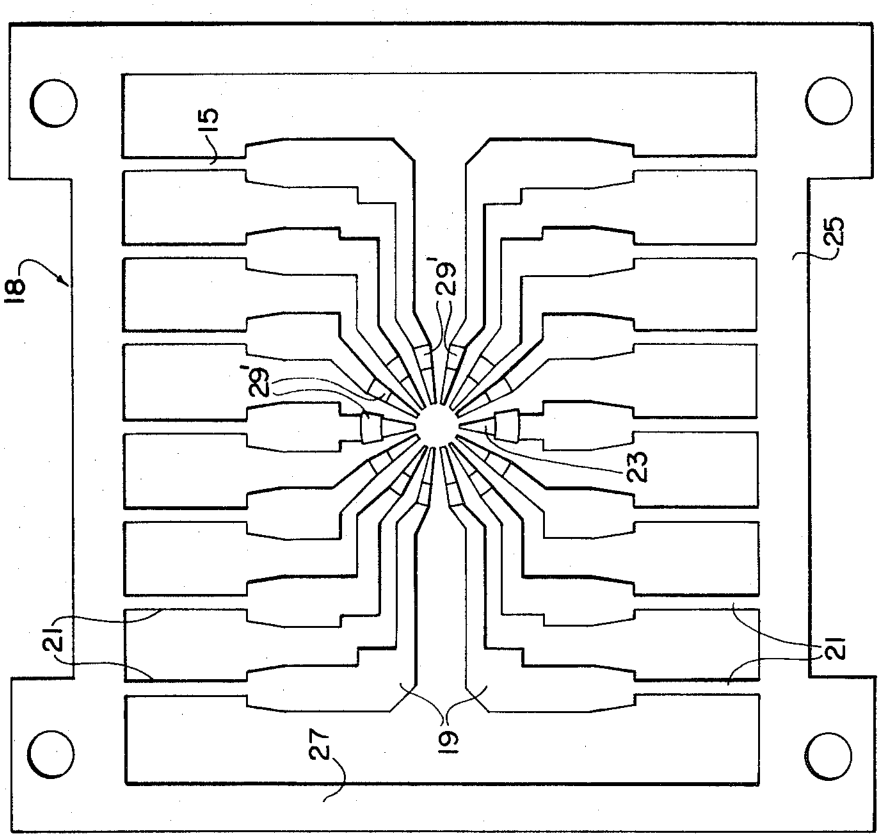
FIG. 7 is an enlarged plan view of a lead frame made in accordance with this invention.

A lead frame 18 produced by blanking the sheet is shown in FIG. 7. Integral lead fingers 19 including outer terminal-forming parts or pins 21 and converging free ends 23 extend inwardly from two opposite side members 25. Free ends 23 of these lead fingers are formed from the thinner material of a reduced thickness portion 13 of the strip 5, and are coated on the flat side of the lead fingers with the bonded metal layer 17. Side members 25, end members 27 and the thicker portion of the lead fingers leading to the free ends thereof all have substantially the same thickness as the strip 5. As shown in FIGS. 3 and 5, concavity 11 has a side wall 29 forming a bevel extending between reduced thickness portion 13 and the surface of the sheet in which the concavity 11 is formed. This bevel appears as a slope 29' between the thin free ends 23 and the thicker portions of the lead fingers 19.

Figure 6:
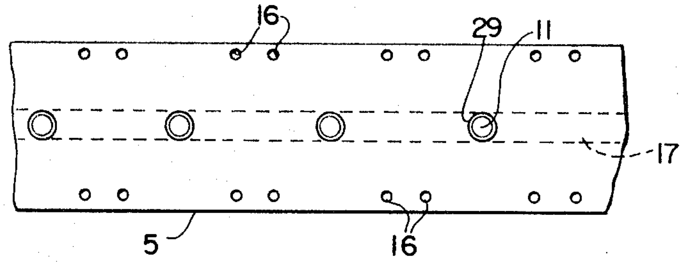
FIG. 6 is a fragmentary plan view of an elongate sheet or strip having a layer of easily weldable material applied thereto in the form of a stripe extending longitudinally thereof.

It should be understood that although the stripe material 17 is shown to comprise a toplay material in FIGS. 4–6, the stripe material 17 could be formed as a partial or full metal inlay in the material 5 within the scope of this invention. That is, the base material 5 could be grooved to receive the metal stripe material 17 so that the stripe is flush with the bottom of the strip 5 or the stripe material 17 could be partially or wholly embedded in the base metal 5 by roll squeezing or the like in any conventional manner.

Although lead frame 18 illustrated in FIG. 7 shows all of the lead fingers 19 extending from the side members 25, it will be understood by those skilled in the art that the lead fingers could alternatively extend from the end members 27 or from both end members and side members 25.

Blanking of a lead frame from a strip of metal is often attended by the formation of small burrs on the free ends of the lead fingers. It is therefore preferable to coin the free ends of the lead fingers by applying pressure between two flat surfaces to reduce such burrs.

Figure 8:
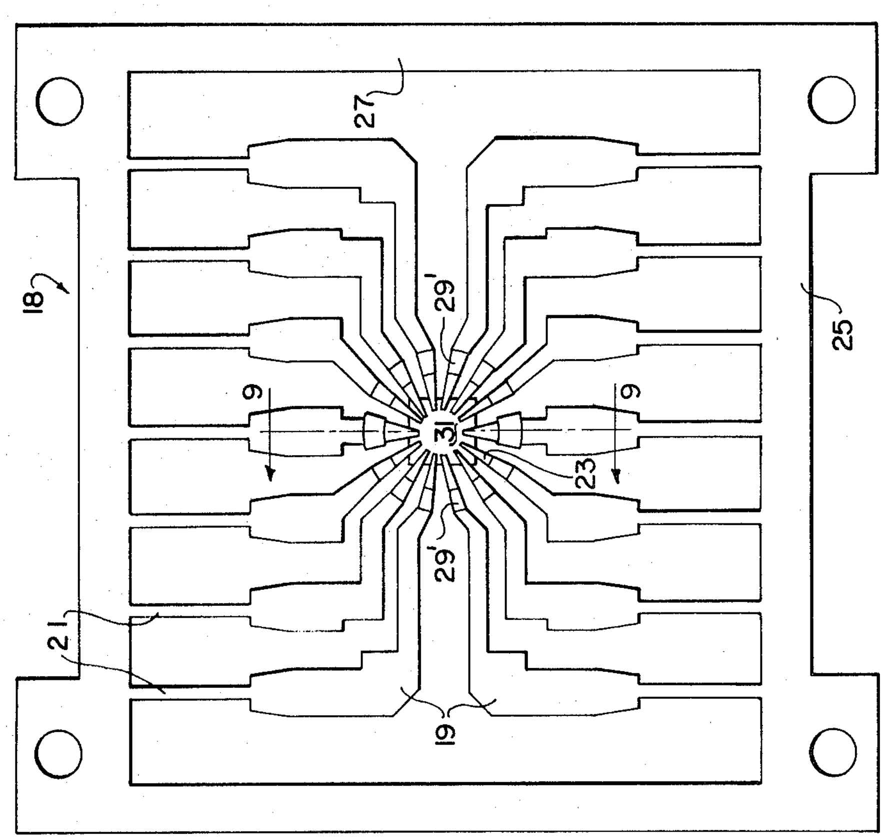
FIG. 8 is an enlarged plan view of a lead frame showing a semiconductor device positioned thereon.
Figure 9:
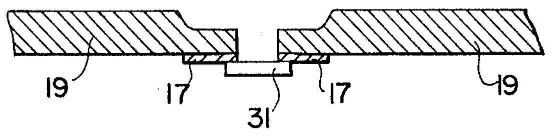
FIG. 9 is a sectional view taken along the line 9—9 of FIG. 8.

To package a semiconductor device such as an integrated circuit chip 31, it is positioned as shown in FIG. 8, so that the free ends 23 of the lead fingers 19 are brought into registry with the circuit terminations on the device. Typically, these terminals are simply contacts or studs arrayed around the surface margins of the device but they may also be conductive extensions or beams cantilevered outwardly from the surface edges. The free ends of the lead fingers are directly connected to the terminals of the device by conventional methods for producing conductive connections of these small dimensions. A preferred method of connecting the free ends to the terminals is ultrasonic welding. Another particularly useful method of making this connection is thermal compression. The effectiveness of each of these methods is greatly enhanced by the presence of a coating of a metal such as aluminum or gold metallurgically bonded to the free ends of the lead fingers on the surface to which the terminals of the device are to be connected. FIG. 9 shows device 31 in position and conductively connected to the free ends 23 of lead fingers 19.

Figure 10:
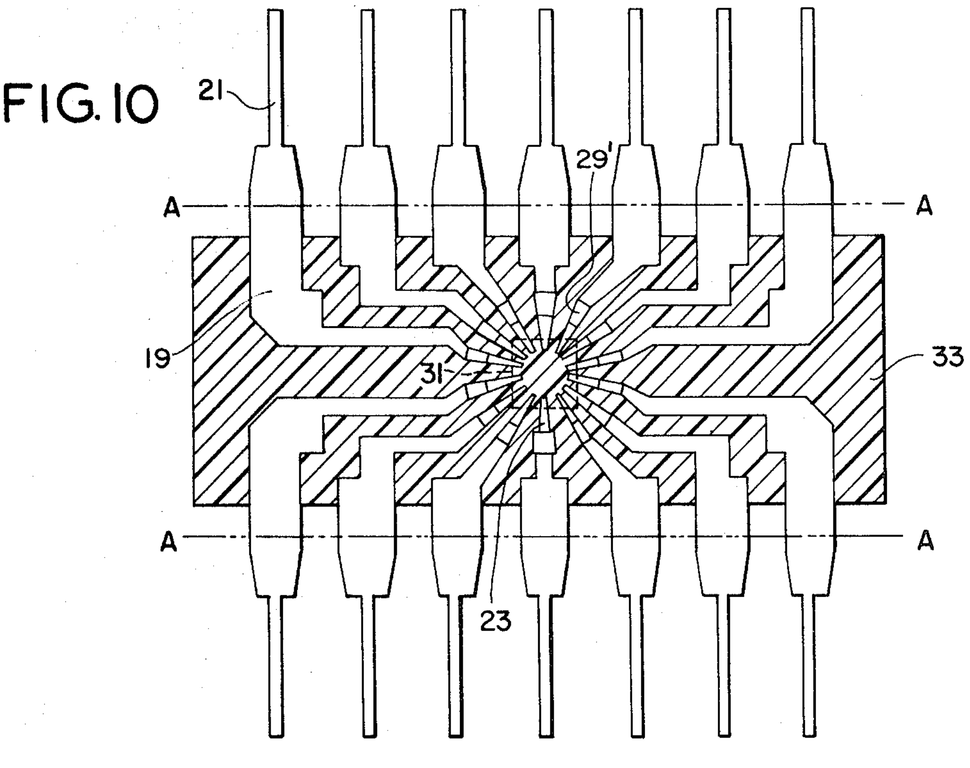
FIG. 10 is an enlarged section taken on line 10—10 of FIG. 11.
Figure 11:
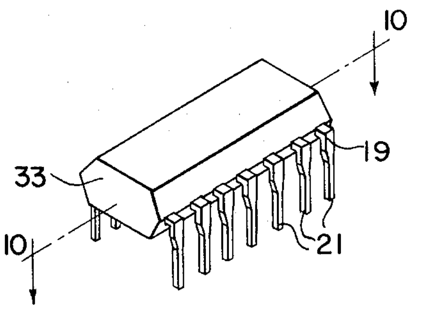
FIG. 11 is a view on a smaller scale of a packaged semiconductor device made according to the invention.

After device 31 has been connected to the lead frame, the device and the inner portions of the lead fingers are encapsulated. Side members 25 and end members 27 are then severed and separated from the resulting assembly. The construction thus produced is shown in FIG. 10 with the encapsulating material indicated at 33. Finally, the lead fingers are bent along the line A–A (FIG. 10) so that plug-in pin terminals 21 extend at right angles to the plane of the mounted chip as illustrated in FIG. 11.

In view of the above, it will be seen that the several objects of the invention are achieved and other advantageous results obtained.

As various changes could be made in the above methods and constructions without departing from the scope of the invention, it is intended that all matter contained in the above description or shown in the accompanying drawings shall be interpreted as illustrative and not in a limiting sense.

What is claimed is:

1. A method of fabricating lead frames for semiconductor devices comprising:

forming a reduced thickness portion in a sheet of conductive material by removing a portion of the conductive material by oxidation of the surface atoms of said conductive material through electron exchange with ionic components of a solution placed in contact with an area of the surface and dissolution of the resultant cations of the conductive material in said solution thereby to form a concavity in the surface of said sheet without inducing stresses in the material; stamping from the sheet a lead frame having integral inwardly extending lead fingers, said stamping extending into said reduced thickness portion of said sheet so that a plurality of said lead fingers are provided with free ends which are formed from the thinner material of said reduced thickness portion.

2. The method set forth in claim 1 wherein the surface atoms of the sheet of conductive material are oxidized by electrochemical exchange of electrons with ionic components of the said solution.

3. The method set forth in claim 1 wherein the surface atoms of the sheet of conductive material are oxidized by chemical exchange of electrons with ionic components of said solution.

4. The method set forth in claim 1 wherein a layer of a metal compatible with the semiconductor device is applied to a surface of the sheet and metallurgically bonded thereto, said layer being of such dimensions and so located as to cover the reduced thickness portion from which said free ends are formed.

5. The method set forth in claim 4 wherein said layer of metal is applied to the surface of the sheet prior to the removal step.

6. The method set forth in claim 4 wherein said sheet is an elongate strip, said layer of metal is applied in the form of a stripe extending longitudinally of said strip, and a series of reduced thickness portions are produced in the strip at intervals therealong.

7. The method set forth in claim 4 wherein said layer of metal compatible with a semiconductor device comprises aluminum or gold.

8. The method set forth in claim 2 wherein the concavity is produced by:

bringing an electrode into close proximity with the portion of the surface of the sheet to be removed;

flowing said solution in the gap between the electrode and the sheet; and electrically connecting the positive terminal of a direct current power source to the sheet and electrically connecting the negative terminal of said power source to said electrode thereby to oxidize a quantity of the conductive material and produce a reduced thickness portion of the sheet adjacent the electrode.

9. The method set forth in claim 3 wherein the said solution is an etch for the conductive material and the concavity is produced by applying an etch to a selected area of the surface of said sheet of conductive material for a time sufficient to oxidize and dissolve a quantity of said conductive material and produce a concavity in the surface of the sheet;

removing said etch containing dissolved conductive material from contact with said sheet; and rinsing said concavity to remove residual etch from contact therewith.

* * * * *